April 22, 1969 F. HUGLE 3,440,027

AUTOMATED PACKAGING OF SEMICONDUCTORS

Filed June 22, 1966

INVENTOR.

Frances Hugle

INVENTOR.

United States Patent Office 3,440,027
Patented Apr. 22, 1969

3,440,027
AUTOMATED PACKAGING OF SEMICONDUCTORS

Frances Hugle, Santa Clara, Calif., assignor to Frances Hugle as trustee of Frances Hugle trust
Filed June 22, 1966, Ser. No. 559,622
Int. Cl. H01l *1/00*
U.S. Cl. 29—193.5 8 Claims

ABSTRACT OF THE DISCLOSURE

A continuous roll form array of packages for flip-chip semiconductor devices and integrated circuits wherein the delicate metal conductors to which the chips are face bonded are supported on a flexible insulating strip. This strip supports an entire roll of packages and provides indexing holes along the sides. The individual packages may contain more than one chip and may provide chip to chip interconnections. The number of external electrical package connections is unlimited.

This invention teaches a method for manufacturing a semiconductor package in a continuous and automatic fashion, wherein the attachment of the semiconductor to the package and the forming of all electrical contacts is made in one operation which is part of the continuous processing of the package.

It is an object of this invention to provide a method of packaging semiconductors which is substantially cheaper than the methods now practiced.

It is a further object of this invention to produce finished semiconductors in a continuous strip suitable for automatic handling at testing stations as well as automatic insertion into electronic equipment.

Other objects and the attendant advantages of this invention will be readily appreciated as the same becomes understood by reference to the following detailed description when considered in connection with the accompanying drawings.

The packages are formed in flexible strips which can be rolled for easy handling and transferring from one machine to another. A roll 12" in diameter and 1" wide would produce about 15,000 packages with 14 leads each each on .100" centers. Fewer leads or closer spacing would result in more packages as more leads or wider spacing results in fewer packages. This procedure is particularly suitable for integrated circuits because of the large number of leads required, but it has substantial advantages also for multichip assemblies and individual transistors.

Starting with a laminate consisting of a metal 1, such as copper or an alloy of nickel, iron and cobalt, on a flexible insulator 2, such as polyethylene terephthalate, an array of patterns 3 is etched in the metal such that the central portion of each pattern provides a contact point 4 for each contact of a semiconductor "flip-chip" or of a group of semiconductor "flip-chips."

Figure 1:
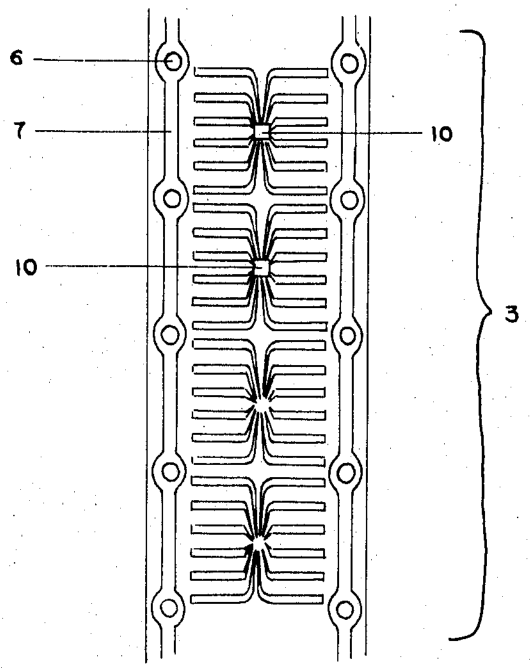
FIGURE 1 shows an array of patterns, some with "flip-chips" already attached.
Figure 2:
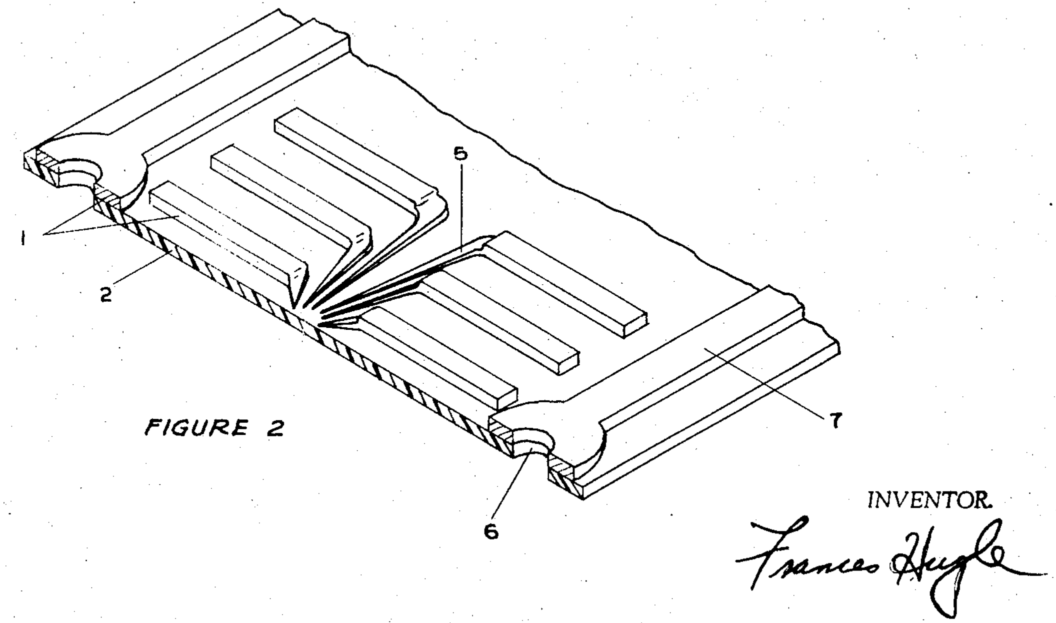
FIGURE 2 shows an enlarged view of part of one pattern.
Figure 3:
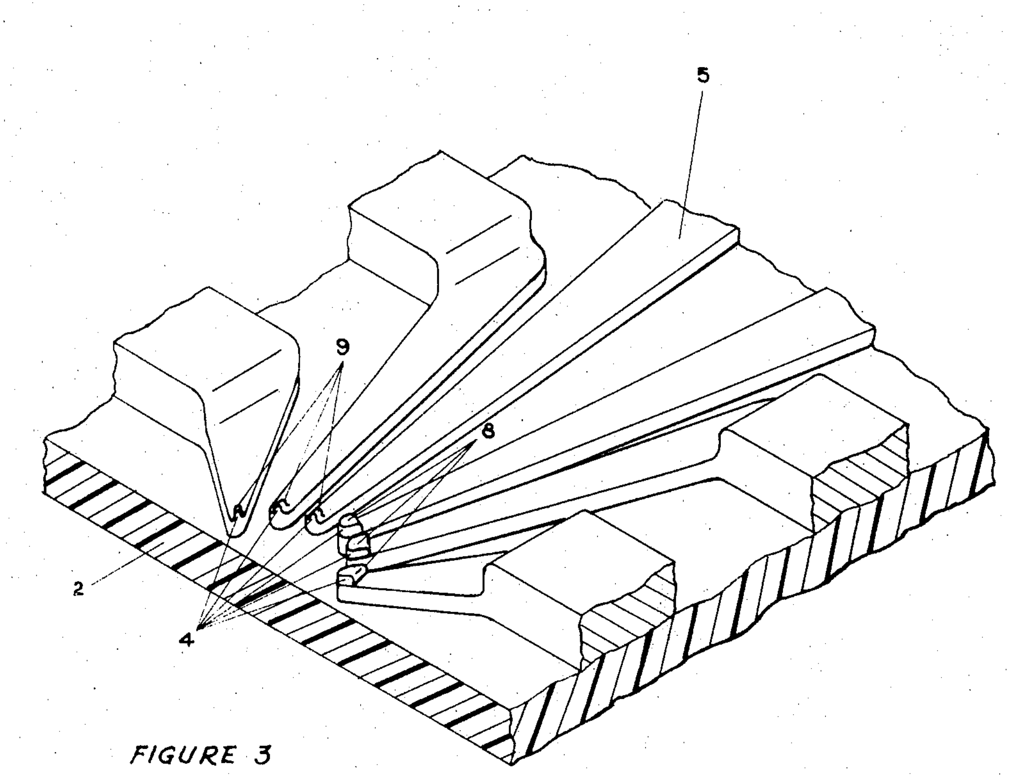
FIGURE 3 shows an enlarged view of the central section of one pattern.
Figure 4:
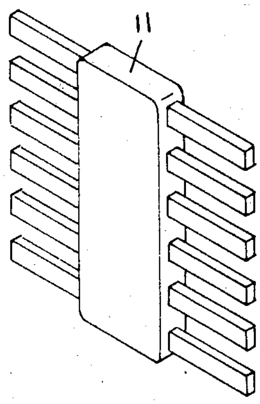
FIGURE 4 shows a single finished package with a moulded body enclosing the semiconductor(s) and part of the patterned laminate.
Figure 5:
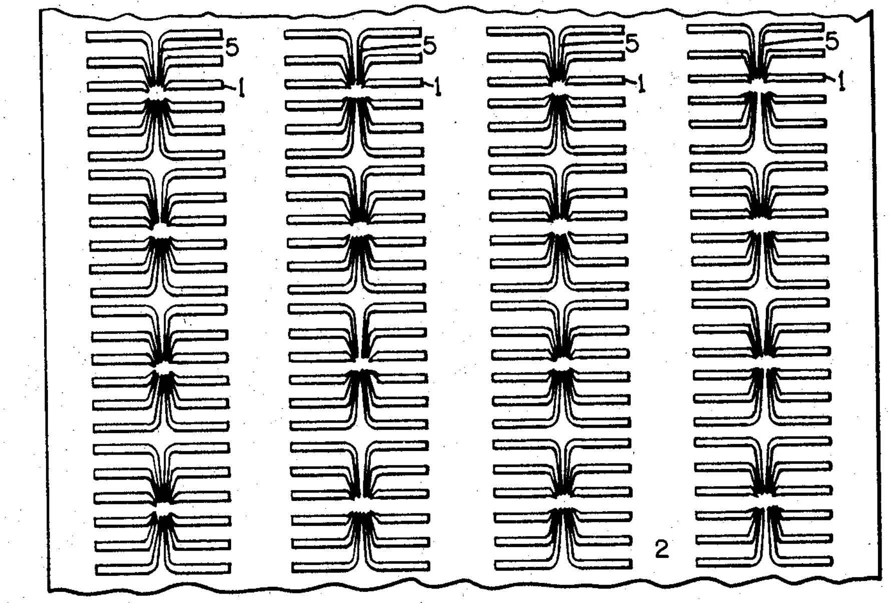
FIGURE 5 shows an alternate embodiment of multiple width of the insulating layer.

The peripheral section of the pattern corresponds to the desired lead arrangement on the finished package. The continuous insulating layer 2 supports the delicate "wires" 5 of the pattern and maintains them in the proper spatial arrangement to each other. Without this support, it would be very difficult and correspondingly expensive to handle these patterns once they have been etched. The pattern in the central portion (FIGURE 3) would typically contain metal strips 5 mils wide on 10 mil centers, while the peripheral section might have .030" leads on .100" centers.

In order to have good definition of the delicate central portion which accepts the semiconductor chip (or chips), the metal cannot be too thick, 2 to 4 mils being a good range. If no great strength or rigidity is required of the external leads, the original metal layer may be 2 to 4 mils thick and the entire pattern may be etched in one operation. However, it is usually required that the external leads be somewhat thicker, 7 to 12 mils, or even more. In this stuation, the pattern will be improved by a three step etch. The central section is thinned to the desired thickness by etching (see FIGURE 3), then the central pattern is etched thru. In a separate etching step, which may precede or follow the foregoing, the peripheral thicker part of the pattern is etched.

To facilitate easy registration from one etching operation to the next, as well as for later ease of handling, it is advisable to punch indexing holes 6 on one or both sides of the strip. Leaving a continuous metal strip 7 to enclose the indexing holes improves the dimensional accuracy considerably. Etching may be done with conventional resist techniques, using either photoresist or screened resists.

The method of chip attachment depends on the type of flip-chip. To attach chips that have raised solderable bumps, the etched patterns is pretinned 8 and the chip is placed upside down and heated to effect mechanical and electrical contact. At the same time the contact points of the pattern are being tinned, it is often desirable to tin the ends of the peripheral leads also. Wave soldering is one technique that works well, the areas not requiring tinning are protected with a resist.

Chips without raised solderable bumps are easily attached ultrasonically if small protrusions 9 are formed on the contact areas of the pattern. These may be produced by etching approximately ½ mil of metal away from the central area except at the points of actual contact. Other flip-chip attachment techniques may be developed which are compatible with this packaging method.

Once the chip 10 has been attached, a top is moulded on 11, by injection or transfer moulding techniques, to protect the chips (or chips) and give strength and rigidity to the package.

While still in strip form and with indexing holes alongside, the finished devices can be rapidly fed into automatic test equipment, which can either mark the bad devices, record them on tape, or, for high level automation, cut them out and splice the strip together again.

If the finished units are not to be delaminated from the insulating film, and there is usually no reason to delaminate, a punch can be used to remove the film from between the leads. If the leads are to be bent at right angles, as in the currently popular "dual-in-line" package, the strip can be fed into a suitable die. However, one of the advantages of this technique is that it is never necessary to handle the packages individually. Large users of two terminal devices (resistors, diodes, etc.) already purchase these components in long strips and automatically feed them into their proper positions on printed circuit boards, bending the leads just before insertion. With the method outlined in this application, it is now possible to do the same thing with the most complex integrated circuit or multichip subsystem.

Even greater efficiency may be obtained by forming the packages on strips wide enough for several rows. Most readily available continuous etchers, as well as resist screeners and contact printers that would be used to produce the patterns will handle rolls 12" wide or more. If necessary, the rolls can be split into single widths before loading into the station for attaching the flip-chips.

Having thus described the invention, what is claimed is:

1. A lead frame for a plurality of semiconductor devices, each having terminals arranged in a predetermined pattern upon one side of each of said devices, comprising;
(a) a single elongated flexible insulator (2),
(b) a single repetitive pattern of metal (1) having a width less than the width of said elongated insulator,
with each repetition of said pattern having plural fingers (5), converging, respectively, to mate with said predetermined pattern, and
(c) each said repetition of said pattern of metal being bonded to said flexible insulator.

2. The lead frame of claim 1, in which;
(a) the thickness of each of said plural fingers (5) is less than the thickness of the remainder of said pattern of metal.

3. The lead frame of claim 2, in which;
(a) the thickness of each of said plural fingers (5) is of the order of one-third that of the remainder of said pattern of metal.

4. The lead frame of claim 1, in which;
(a) each repetition of said repetitive pattern of metal (1) is separate from other repetitions,
whereby separate electrical connections can be made to each said repetition of said pattern.

5. The lead frame of claim 1, in which;
(a) the thickness of the central portion of each of said plural fingers is less than the thickness of the remainder of said pattern of metal, and
(b) the thickness of the extremity of each of said plural fingers is greater than the thickness of said central portion,
whereby protrusions (9) are formed on each said extremity.

6. The lead frame of claim 5, in which;

(a) each said protrusion (9) is pretinned (8) upon the surface thereof away from said flexible insulator (2).

7. The lead frame of claim 1, which additionally includes;
(a) a series of holes equally spaced lengthwise of said elongated flexible insulator out of electrical contact with said repetitive pattern of metal,
whereby separate electrical connections can be made to each repetition of said pattern.

8. The lead frame of claim 1, in which;
(a) said single elongated flexible insulator has a width that is a multiple of the width of said single repetitive pattern of metal, and
(b) the whole of each of a plurality of repetitive patterns of metal are bonded mutually parallel longitudinally upon said elongated insulator.

References Cited

UNITED STATES PATENTS

| | | | |
|---|---|---|---|
| 2,849,298 | 8/1958 | Werberig | 156—3 |
| 3,192,307 | 6/1965 | Lazar. | |
| 3,317,287 | 5/1967 | Caracciolo. | |
| 3,178,506 | 5/1965 | Dereich et al. | |
| 3,203,075 | 8/1965 | Foster et al. | 29—155.5 |
| 3,204,329 | 9/1965 | Sweeney | 29—155.5 |
| 3,256,465 | 6/1966 | Weissenstern et al. | |
| 3,281,628 | 10/1966 | Bauer et al. | |
| 3,292,241 | 12/1966 | Carroll. | |

FOREIGN PATENTS

| | | |
|---|---|---|
| 1,374,721 | 8/1964 | France. |

DARRELL L. CLAY, *Primary Examiner.*

U.S. Cl. X.R.

317—235; 206—65, 56; 113—119; 29—627; 174—68.5, 52